United States Patent
Park et al.

(10) Patent No.: US 11,025,240 B2
(45) Date of Patent: Jun. 1, 2021

(54) CIRCUITS FOR DELAY MISMATCH COMPENSATION AND RELATED METHODS

(71) Applicant: MediaTek Inc., Hsin-Chu (TW)

(72) Inventors: Henry Arnold Park, Irvine, CA (US); Tamer Mohammed Ali, Irvine, CA (US)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/671,974

(22) Filed: Aug. 8, 2017

(65) Prior Publication Data

US 2018/0167061 A1    Jun. 14, 2018

Related U.S. Application Data

(60) Provisional application No. 62/433,860, filed on Dec. 14, 2016.

(51) Int. Cl.
*H03K 5/159*        (2006.01)
*H03K 5/15*         (2006.01)
(Continued)

(52) U.S. Cl.
CPC .............. *H03K 5/159* (2013.01); *G06F 1/10* (2013.01); *H03K 5/151* (2013.01); *H03K 5/1502* (2013.01);
(Continued)

(58) Field of Classification Search
CPC .... G06F 1/00; G06F 1/10; H03K 3/00; H03K 3/0315; H03K 2005/00195; H03K 5/00;
(Continued)

(56) References Cited

U.S. PATENT DOCUMENTS

| | | | |
|---|---|---|---|
| 4,700,346 A | | 10/1987 | Chandran et al. |
| 5,204,559 A | * | 4/1993 | Deyhimy ............... H03K 5/131 327/114 |

(Continued)

FOREIGN PATENT DOCUMENTS

| | | |
|---|---|---|
| CN | 102150361 A | 8/2011 |
| CN | 103259539 A | 8/2013 |
| CN | 103297052 A | 9/2013 |

OTHER PUBLICATIONS

Extended European Search Report dated May 23, 2018 in connection with European Application No. 17197178.1.

*Primary Examiner* — Lincoln D Donovan
*Assistant Examiner* — Dave Mattison
(74) *Attorney, Agent, or Firm* — Wolf, Greenfield & Sacks, P.C.

(57) ABSTRACT

Circuits and methods for delay mismatch compensation are described. A circuit may comprise multiple data paths between a signal source, such as a driver, and a load. The paths may have different lengths, thus causing delay mismatches. An exemplary circuit of the type described herein may comprise delay elements and at least one feedback circuit designed to compensate for such delay mismatches. The circuit may operate in different phases, such as a compensation phase and a driving phase. In the compensation phase, rings oscillators including delay elements and the at least one feedback circuit may be formed. In this phase the delay may be adjusted to compensate for mismatches. In the driving phase, the signal source may be connected to the load.

20 Claims, 12 Drawing Sheets

(51) Int. Cl.
*G06F 1/10* (2006.01)
*H03K 5/151* (2006.01)
*H03K 3/03* (2006.01)
*H03K 5/00* (2006.01)

(52) U.S. Cl.
CPC . *H03K 3/0315* (2013.01); *H03K 2005/00019* (2013.01)

(58) Field of Classification Search
CPC .......... H03K 5/13; H03K 5/132; H03K 5/133; H03K 5/1502; H03K 5/151; H03K 5/159; H03K 2005/00; H03K 2005/00019; H03K 2005/00143
USPC ........................................................ 327/262
See application file for complete search history.

(56) References Cited

U.S. PATENT DOCUMENTS

| | | | |
|---|---|---|---|
| 2008/0094099 A1* | 4/2008 | Goh | H03L 7/0812 326/21 |
| 2012/0019262 A1* | 1/2012 | Zhang | G01R 31/31725 324/617 |
| 2016/0211835 A1 | 7/2016 | Wu et al. | |

* cited by examiner

CIRCUITS FOR DELAY MISMATCH COMPENSATION AND RELATED METHODS

RELATED APPLICATIONS

This Application claims priority under 35 U.S.C. § 119(e) to U.S. Provisional Application Ser. No. 62/433,860, entitled "Precise Skew Control by Built-In Oscillator with Shared-Feedback Path" filed on Dec. 14, 2016, which is herein incorporated by reference in its entirety.

TECHNICAL FIELD

This application relates to electronic circuits for compensating for delay mismatches arising in signal lines.

BACKGROUND

Electric signals are often transmitted through metal traces formed on printed circuit boards. Such metal traces can be used to couple the electric signals between circuitry integrated within a chip and an electrical connector mounted on the printed circuit board.

BRIEF SUMMARY

According to one aspect of the present application, a circuit for driving a load is provided. the circuit may comprise a signal driver; a first signal path portion that is a portion of a first signal path from the signal driver to the load; a second signal path portion that is a portion of a second signal path from the signal driver to the load; and control circuitry configured to: control the circuit to form a first ring oscillator during a first time period and sense a first cadence of the first ring oscillator, the first ring oscillator including the first signal path portion; control the circuit to form a second ring oscillator during a second time period and sense a second cadence of the second ring oscillator, the second ring oscillator including the second signal path portion; control the circuit to compensate for a delay mismatch between the first and second signal paths at least partially based on the first cadence and the second cadence; wherein the signal driver is configured to drive the first signal path portion with a first signal and drive the second signal path portion with a second signal after the circuit is controlled to compensate for the delay mismatch.

In some embodiments, the first signal path portion comprises a first controllable delay element.

In some embodiments, the control circuitry is configured to control the circuit to compensate for delay mismatch by controlling the controllable delay element.

In some embodiments, the second signal path portion comprises a second controllable delay element.

In some embodiments, the control circuitry is further configured to sense a first delay introduced by the first controllable delay element, sense a second delay introduced by the second delay element, and compute a difference between the first and second delay.

In some embodiments, the first and second ring oscillators share a common feedback circuit.

In some embodiments, the first cadence comprises a first oscillation period and the second cadence comprises a second oscillation period.

In some embodiments, the circuit further comprises a counter configured to provide an indication of the first cadence by counting how many transitions occur throughout a sensing time interval.

In some embodiments, the delay mismatch is caused, at least in part, by a length difference between a first and second metal trace.

In some embodiments, the circuit is disposed on an integrated circuit (IC) configured to be mounted on a printed circuit board (PCB), and wherein the first and second metal traces are formed on the PCB.

In some embodiments, the first and second time periods do not overlap.

According to another aspect of the present application, a circuit for driving a load is provided. The circuit may comprise a signal driver; a feedback circuit; a first signal path portion comprising a first delay element, the first signal path portion being coupled to the feedback circuit via a first switch and to the signal driver; a second signal path portion comprising a second delay element, the second signal path portion being coupled to the feedback circuit via a second switch and to the signal driver; control circuitry configured to control a delay difference arising between the first and second delay elements to compensate for a target delay mismatch; wherein, when the first switch is conductive, the first delay element and the feedback circuit form a first ring oscillator, and when the second switch is conductive, the second delay element and the feedback circuit form a second ring oscillator.

In some embodiments, the target delay mismatch represents a delay mismatch between a first and a second metal trace.

In some embodiments, the circuit is disposed on an integrated circuit (IC) configured to be mounted on a printed circuit board (PCB), and wherein the first and second metal traces are formed on the PCB.

In some embodiments, the first ring oscillator is configured to provide a first resonating signal and the second ring oscillator is configured to provide a second resonating signal.

In some embodiments, when the first switch is conductive, the second switch is non-conductive.

In some embodiments, each of the first and second delay element comprises a plurality of switched capacitors.

According to yet another aspect of the present application, a method for driving a load is provided. The method may comprise controlling a circuit to form a first ring oscillator during a first time period and sense a first cadence of the first ring oscillator, the first ring oscillator including a portion of a first signal path; controlling the circuit to form a second ring oscillator during a second time period and sense a second cadence of the second ring oscillator, the second ring oscillator including a portion of a second signal path; controlling the circuit to compensate for a delay mismatch between the first and second signal paths at least partially based on the first cadence and the second cadence; and driving the first signal path with a first signal and driving the second signal path with a second signal after the circuit is controlled to compensate for the delay mismatch.

In some embodiments, the method further comprises controlling a delay introduced by a first delay element that is part of the portion of the first signal path.

In some embodiments, sensing the first cadence of the first ring oscillator comprises counting how many transitions occur throughout a sensing time interval.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

The inventors have developed methods and systems for delay mismatch compensation in electronic circuits. Electronic circuits often include multiple signal paths connecting various points of the electronic circuit with one another. In some circumstances, it is desirable that the various points receive electrical signals that are mutually synchronized. However, multiple paths may have different lengths, and as a result may give rise to different delays, thus hindering the ability to maintain signal synchronization. Such length differences are often uncontrollable, and may be caused by finite tolerances in the fabrication of electronic circuits. In other circumstances, such length differences are included purposely.

Circuit designers often rely on multiple signal paths to convey data between points of an electronic circuit. One example is differential signals. Differential signals are formed by generating a pair of complementary signals. Differential signals offer several advantages over single-ended signals, including higher immunity to common-mode noise and electromagnetic interference. However, in some circumstances, differential signals may suffer from delay mismatches caused by differences in the length of the conductive pair that carry them. Such differences in length may negatively impact the quality of the differential signal. For example, the differential signal may exhibit a deterioration in the signal-to-noise ratio. The differences in length may be a result of the difficulty of designing perfectly matching metal traces, especially when the metal traces include bends, curves, loops, etc. This may be the case in printed circuit boards or in integrated circuits, where several metal traces are often routed in a single plane.

Figure 1:
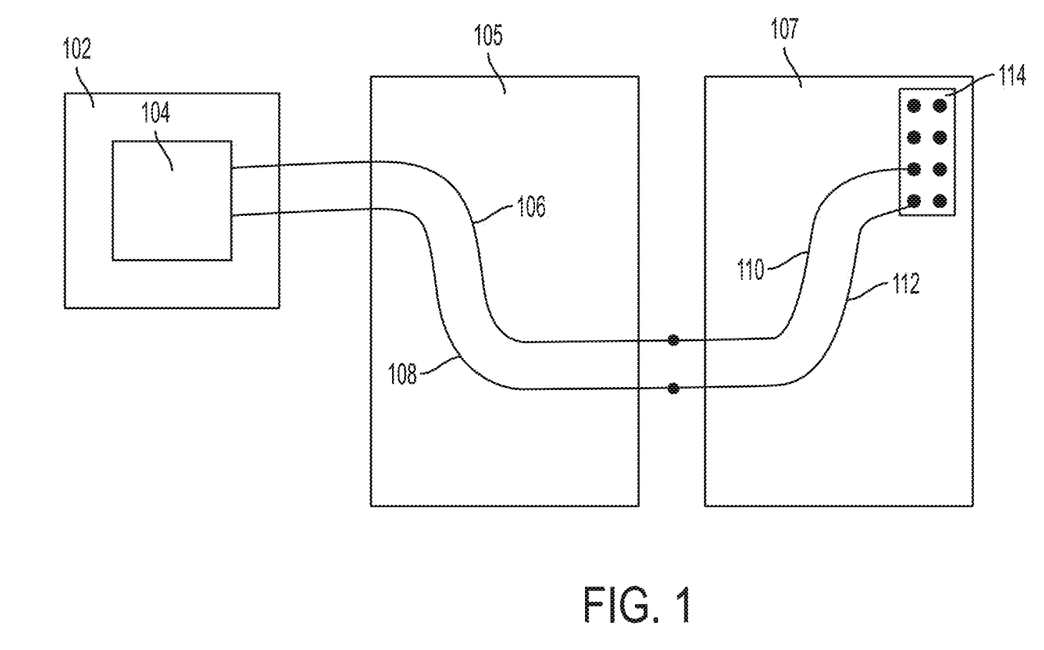
FIG. 1 is schematic diagram illustrating a circuit driver connected to a printed circuit board.

FIG. 1 is a schematic diagram illustrating an integrated circuit 102 coupled to a printed circuit board 107. Integrated circuit 102 includes driver 104, which outputs a pair of differential signal lines. Integrated circuit 102 is disposed in a package 105, which is mounted on printed circuit board 107. For the sake of clarity, integrated circuit 102, package 105 and printed circuit board 107 are illustrated as being separate in FIG. 1. The differential signal is routed to a connector 114 via contacts 106 and 108, which are part of package 105, and metal traces 110 and 112, which are formed on printed circuit board 107. As illustrated, the signal paths between driver 104 and connector 114 encounter multiple bends. As a result, it may be difficult to design perfectly matching signal paths, and delay mismatches may arise.

The inventors have developed methods and systems for delay mismatch compensation in electronic circuits that utilize signal paths to a load. In some embodiments, the delay mismatch may be reduced, or even canceled, by controlling delay elements to counter a measured delay difference. For example, the delay difference may be set to be equal to, but with opposite sign, the measured delay mismatch.

In some embodiments, delay mismatches arising in electronic circuits are sensed during a measuring phase. For example, the delay difference arising between two signal lines (such as metal traces 110 and 112) configured to carry a differential signal is sensed. During the measuring phase, the delay difference may be sensed using "off-chip" equipment; that is, using a circuit other than the chip used for driving signals down the signal lines.

In some embodiments, the delay mismatch sensed during the measuring phase may be compensated (e.g., canceled or limited) during a compensation phase. Compensation may be accomplished by introducing, along the signals lines, a delay difference to counteract the sensed delay mismatch. For example, in some embodiments, the introduced delay difference may be equal in amplitude and opposite in sign relative to the sensed delay mismatch. Of course, not all embodiment are limited to such specific delay differences. In some embodiments, the circuitry used for the compensation of the sensed delay mismatch may be "on-chip"; that is, may be part of the chip used for driving signals down the signals lines. In these embodiments, the delay difference may be introduced in the chip.

Once the delay mismatch has been canceled, or at least limited, the signals lines may be driven using a signal driver. This phase is referred to as the driving phase. In at least some of the embodiments in which the circuitry for compensating delay mismatch is on-chip, the signal driver may also be on-chip.

Figure 2A:
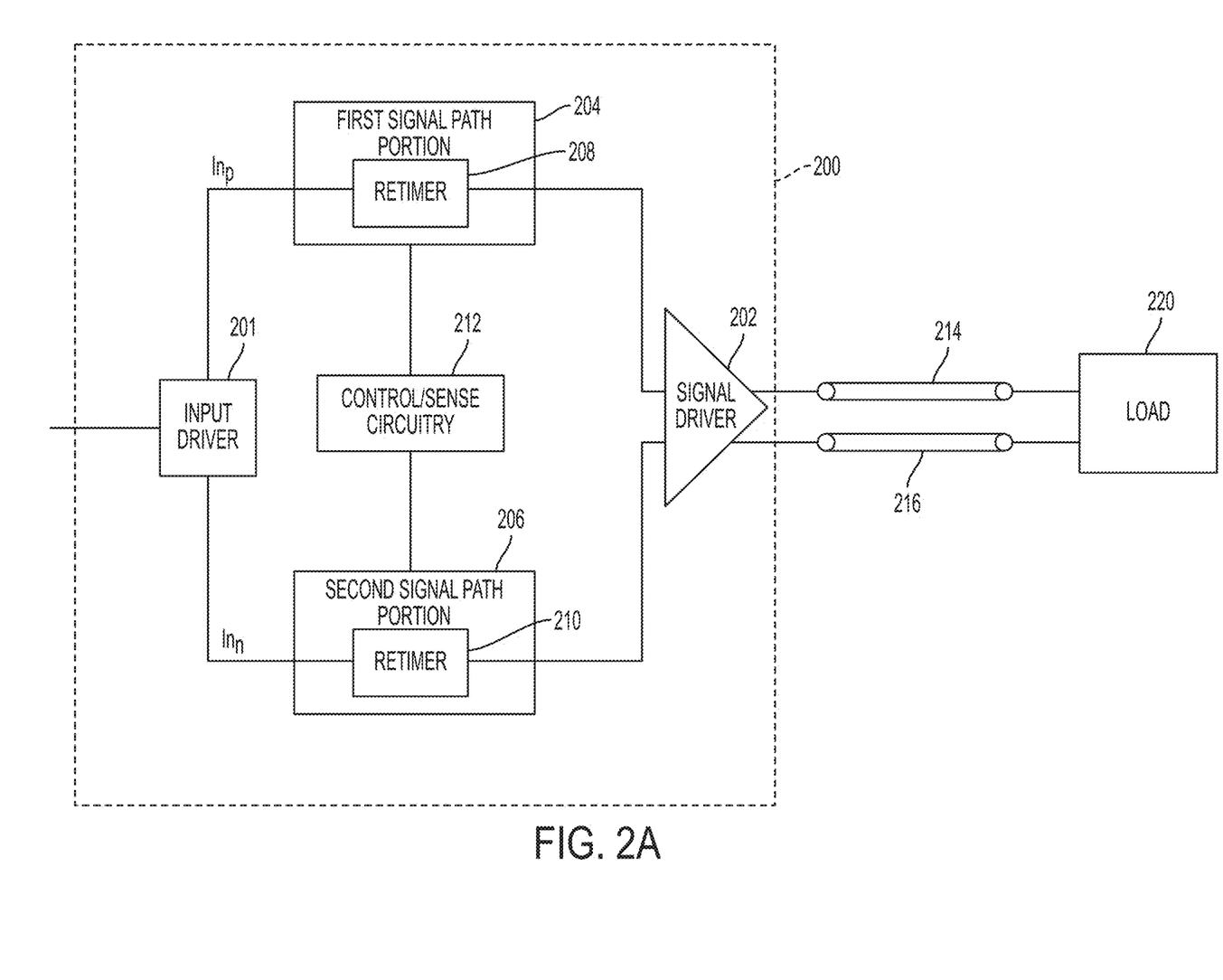
FIG. 2A is a block diagram illustrating a circuit for delay mismatch compensation, according to some non-limiting embodiments.

FIG. 2A illustrates schematically a circuit for delay mismatch compensation, in accordance with some embodiments. Circuit 200 may be connected to a load 220 via connections 214 and 216. Connections 214 and 216 may represent any suitable type of signal line, including metal traces, wires, cables, connectors, metal pins, wire bonds, or combinations thereof. Load 220 may represent any suitable type of electronic circuit, whether analog or digital. In some embodiments, load 220 is mounted on a printed circuit board. In some embodiments, circuit 200 may be part of an integrated circuit mounted on such a printed circuit board.

Circuit 200 may include input driver 201, signal driver 202, first signal path portion 204, second signal path portion 206, and control/sense circuitry 212. Input driver 201 may comprise circuitry for providing a differential signal pair $In_p$, $In_n$. For example, input driver 201 may comprise an amplifier, a signal buffer, a timing circuit and/or simply a pair of conductive terminals or pads for outputting $In_p$ and $In_n$. Signal driver 202 may include any suitable type of driver, including a signal amplifier, a power amplifier, a signal buffer, a signal source, a digital-to-analog converter (DAC), or any combination thereof. Signal path portions 204 and 206 may couple the differential signal $In_p$, $In_n$ to load 220 via connections 214 and 216. In this respect, first signal path portion 204 and connection 214 may collectively form a first signal path, and second signal path portion 206 and connection 216 may collectively form a second signal path, wherein the first and second signal paths may respectively couple signals $In_p$ and $In_n$ to load 220. First signal path portion 204 may include retimer 208 and second signal path portion 206 may include retimer 210. The signals path portions may further include other electronic components and/or metal traces. Retimers 208 and 210 may be configured to introduce a time delay along the corresponding signal path portion. This time delay may be controlled using control/sense circuitry 212. In some embodiments, control/sense circuitry 212 includes a memory unit, which may be configured to store information indicative of the delay mismatch between connections 214 and 216 (referred to herein as the "target delay mismatch"). Such information may be obtained during a characterization phase, as will be described further below. Based on this information, control-sense circuitry 212 may adjust the delays introduced by retimers 208 and 210. The amount of delay introduced may be configured to compensate for the delay mismatch between connections 214 and 216. In this way, the overall delay mismatch at the load may be limited or canceled. It should be appreciated that, while the example of FIG. 2A illustrates signal path portions each having a retimer, in other embodiments, only one signal path portion may include a retimer. Retimers of the types described herein may be implemented in any of numerous way, whether in the analog or the digital domain. In some embodiments, the retimers may be implemented using a multiplexer or a flip-flop (e.g., a D-type flip flop).

Figure 2B:
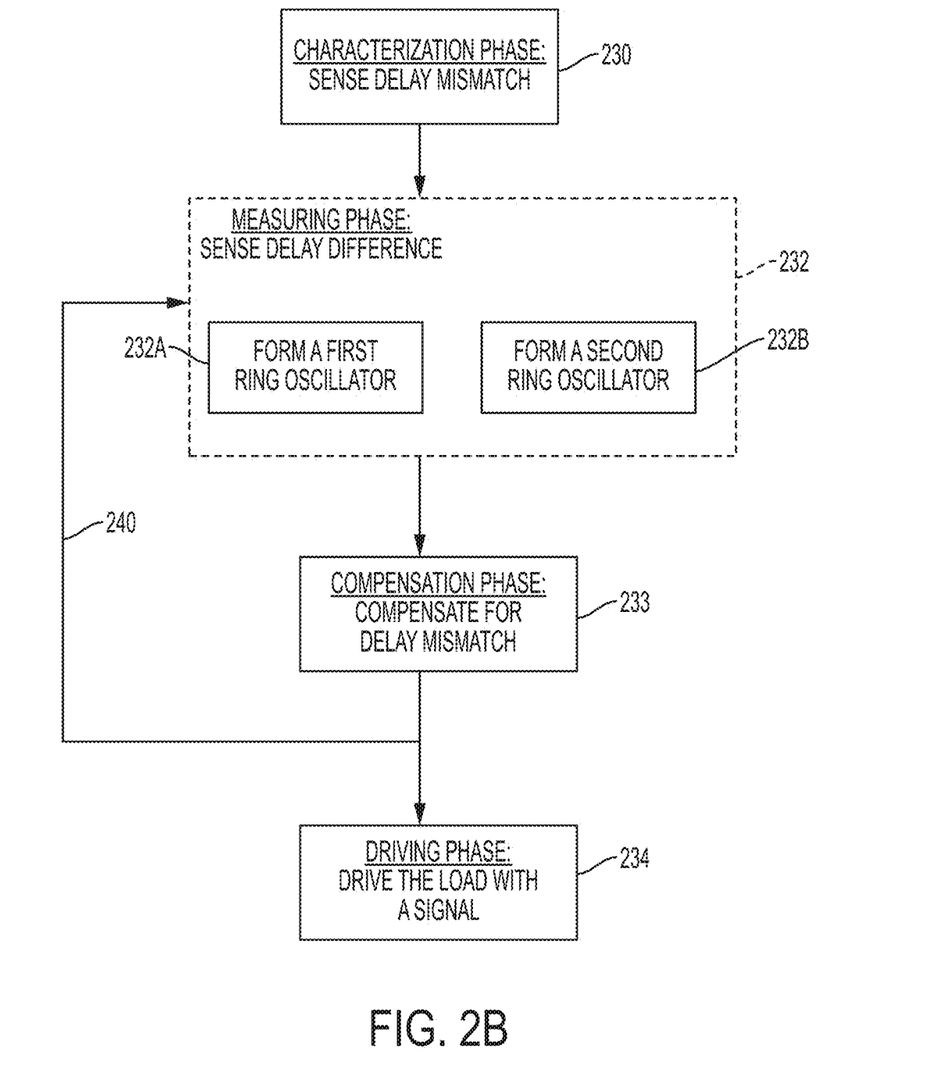
FIG. 2B is a flowchart illustrating a plurality of operating phases, according to some non-limiting embodiments.

Circuit 200 may be configured to operate in a plurality of different phases. FIG. 2B is a flowchart illustrating such operating phases. In the characterization phase 230, the delay mismatch between two or more connections may be sensed. In some embodiments, the delay mismatch may be measured using a test circuit board (e.g., a PCB). Such printed circuit board may be substantially identical (e.g., but for variations owing to finite fabrication tolerances) to the printed circuit board on which circuit 200 is intended to be mounted. In such embodiments, the sensed connections may be substantially identical to connections 214 and 216. In other embodiments, the delay mismatch may be measured using the very same circuit board on which circuit 200 is mounted. Information indicative of the measured delay mismatch may be stored in a memory of circuit 200, for example in a memory of control/sense circuitry 212.

In the measuring phase 232, the delay difference between the signal path portions of circuit 200 may be sensed. Such a delay difference may be sensed in any of numerous ways. For example, as illustrated in blocks $232_A$ and $232_B$, a first ring oscillator and a second ring oscillator may be formed and may be used to sense the delay difference between first signal path portion 204 and second signal path portion 206.

Figure 2C:
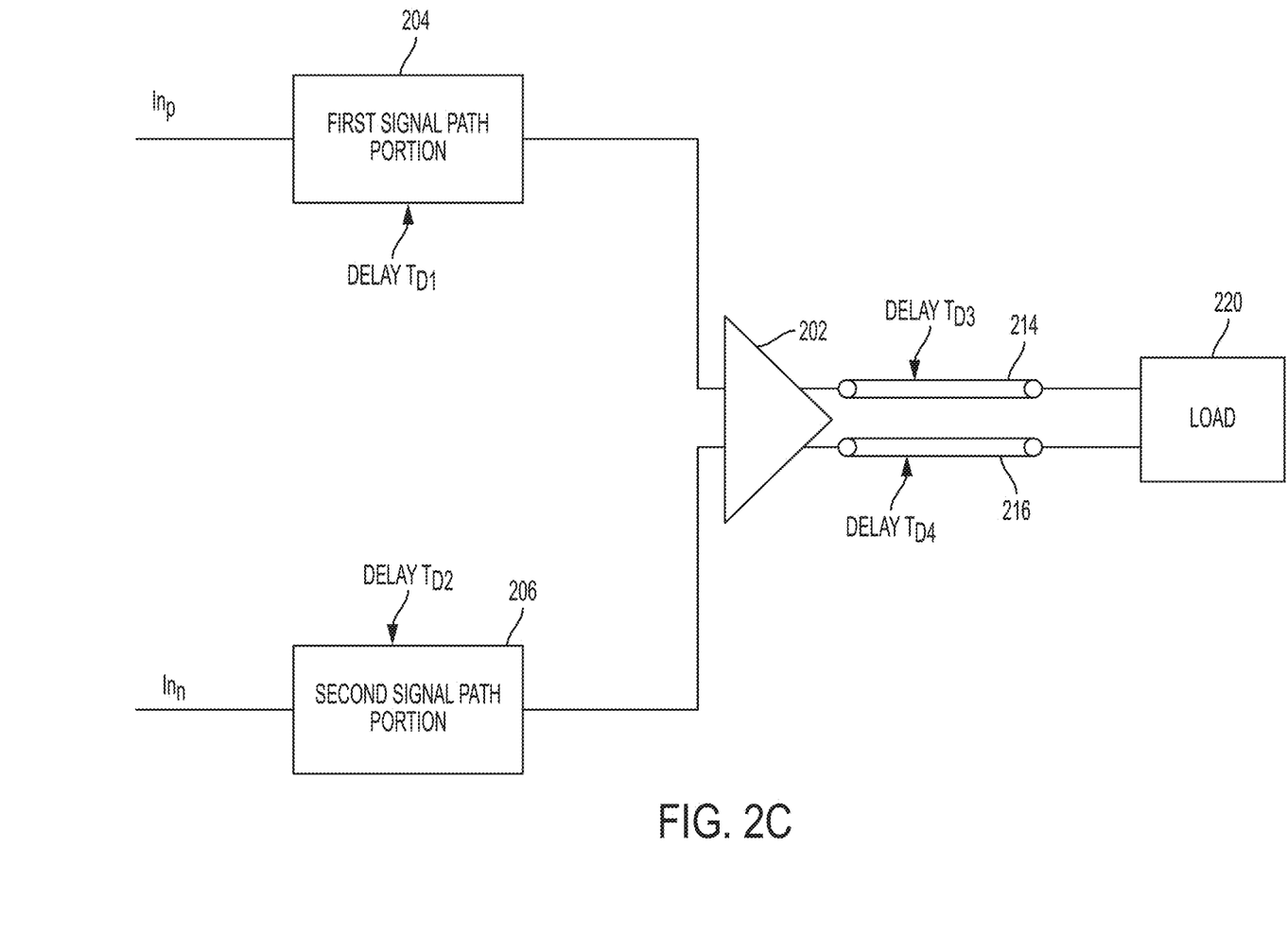
FIG. 2C is an example of a circuit for delay mismatch compensation, according to some non-limiting embodiments.

In the compensation phase 233, the delay mismatch sensed in the characterization phase may be compensated. For example, the compensation may comprise comparing the delay mismatch measured in the characterization phase with the delay difference measured in the measuring phase. Based on the comparison, the delay difference introduced by the signal path portions of circuit 200 may be adjusted, for example using retimers 208 and 210, until the delay mismatch is canceled or at least limited by a desired amount (e.g., until the delay mismatch is below a predefined threshold). One example of a compensation phase in illustrated in FIG. 2C. In this example, connection 214 introduces a delay $T_{D3}$ and connection 216 introduce a delay $T_{D4}$. As a result, the characterization phase provides a delay mismatch $T_{D3}-T_{D4}$. In the compensation, phase the delays $T_{D1}$ and $T_{D2}$ introduced by first and second signal path portions 204 and 206, respectively, may be adjusted such that $T_{D1}-T_{D2}=T_{D4}-T_{D3}$. In this way, a signal traveling through first signal path portion 204 and connection 214 may experience the same overall delay as a signal traveling through second signal path portion 206 and connection 216. As part of the compensation phase, it may be determined whether the compensation has been performed accurately. For example, it may be determined whether, after the compensation, $T_{D1}-T_{D2}=T_{D4}-T_{D3}$. If it is determined that the compensation has been performed accurately, the driving phase may commence. Otherwise, another iterations through the measuring phase may be performed (as shown by arrow 240 of FIG. 2B).

Referring back to FIG. 2B, circuit 200 may drive load 220 with a signal via connections 214 and 216 in the driving phase 234. The signal may be differential in some embodiments. Following the compensation performed during compensation phase 233, the signal path portion comprising retimer 208 and connection 214 may have substantially the same delay (e.g., with a delay mismatch that is less than 5% of the total delay between signal driver 202 and load 220) as the signal path portion comprising retimer 210 and connection 216.

Figure 3:
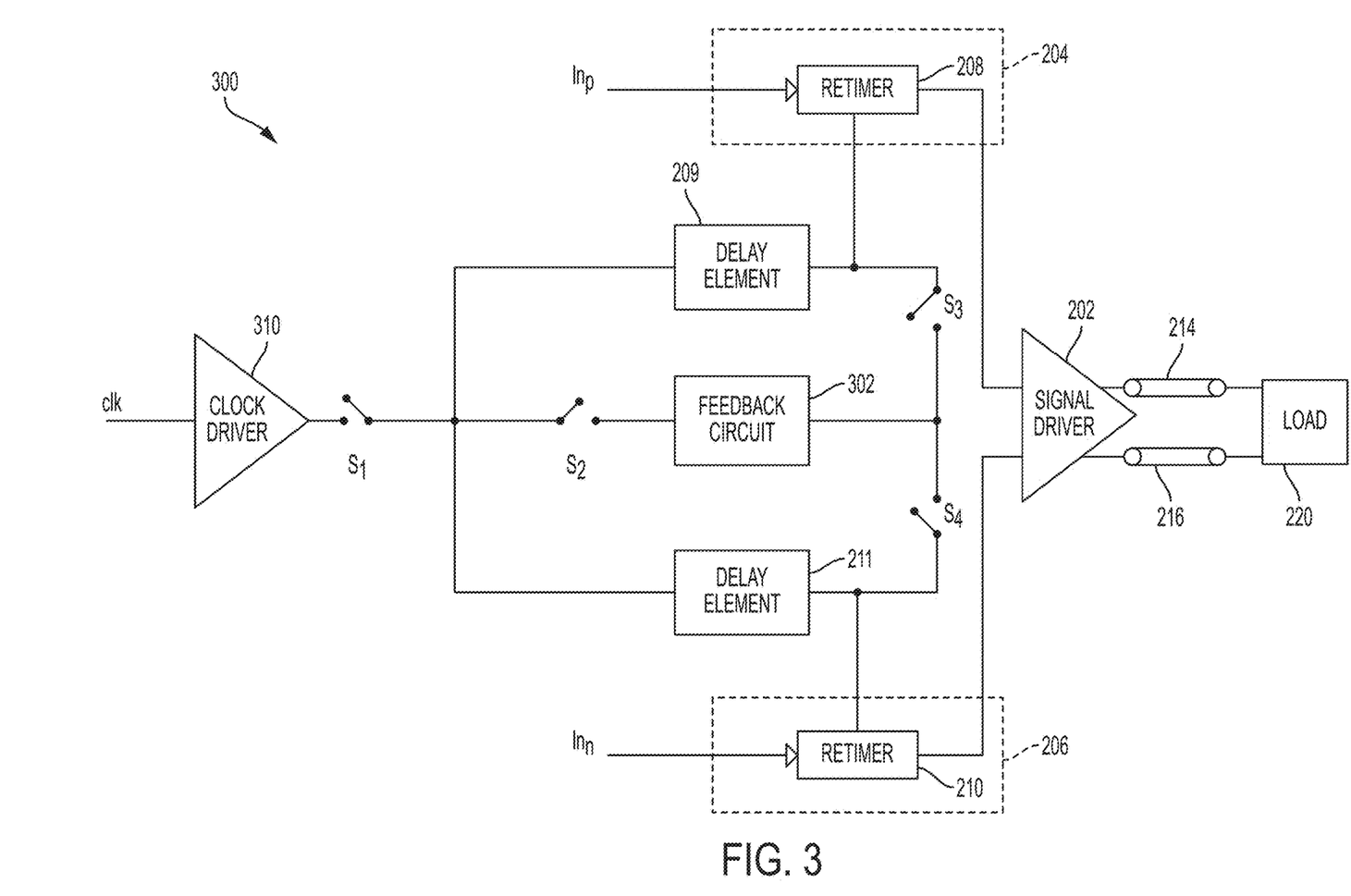
FIG. 3 is a block diagram illustrating a circuit for delay mismatch compensation comprising a plurality a delay elements and a feedback circuit, according to some non-limiting embodiments.

FIG. 3 illustrates schematically an exemplary implementation of circuit 200, in accordance with some embodiments. Circuit 300 may be used to form one or more ring oscillators. In addition to signal driver 202 and retimers 208 and 210, circuit 300 may further include clock driver 310, delay elements 209 and 211, feedback circuit 302 and switches S1, S2, S3, and S4. Switch S1 may couple clock driver 310 to delay elements 209 and 211, thus providing a path for clock signal clk. Clock driver 310 may be implemented using any suitable digital driver, such as inverters. Switch S2 may couple feedback circuit 302 to delay elements 209 and 211. Switch S3 may couple delay element 209 to feedback circuit 302 and switch S4 may couple delay element 211 to feedback circuit 302. Switches S1, S2, S3 and S4 may assume one of two possible states. In the on-state, a switch may provide a low impedance path between its terminals, thereby electrically connecting the two components to which the switch is coupled. In the off-state, a switch may provide a high impedance path between its terminals, thereby electrically isolating the two components. The state of the switches may be controlled using control/sense circuitry 212 (not shown in FIG. 3). Switches S1, S2, S3 and S4 may be implemented in any suitable way, for example using field effect transistors (FETs). In some embodiments, delay elements 209 and 211 are configured to delay the clock signal clk.

Circuit 300 may operate in a plurality of configurations. The configuration in which circuit 300 operates may be dictated by the state of switches S1, S2, S3, and S4.

Figure 4A:
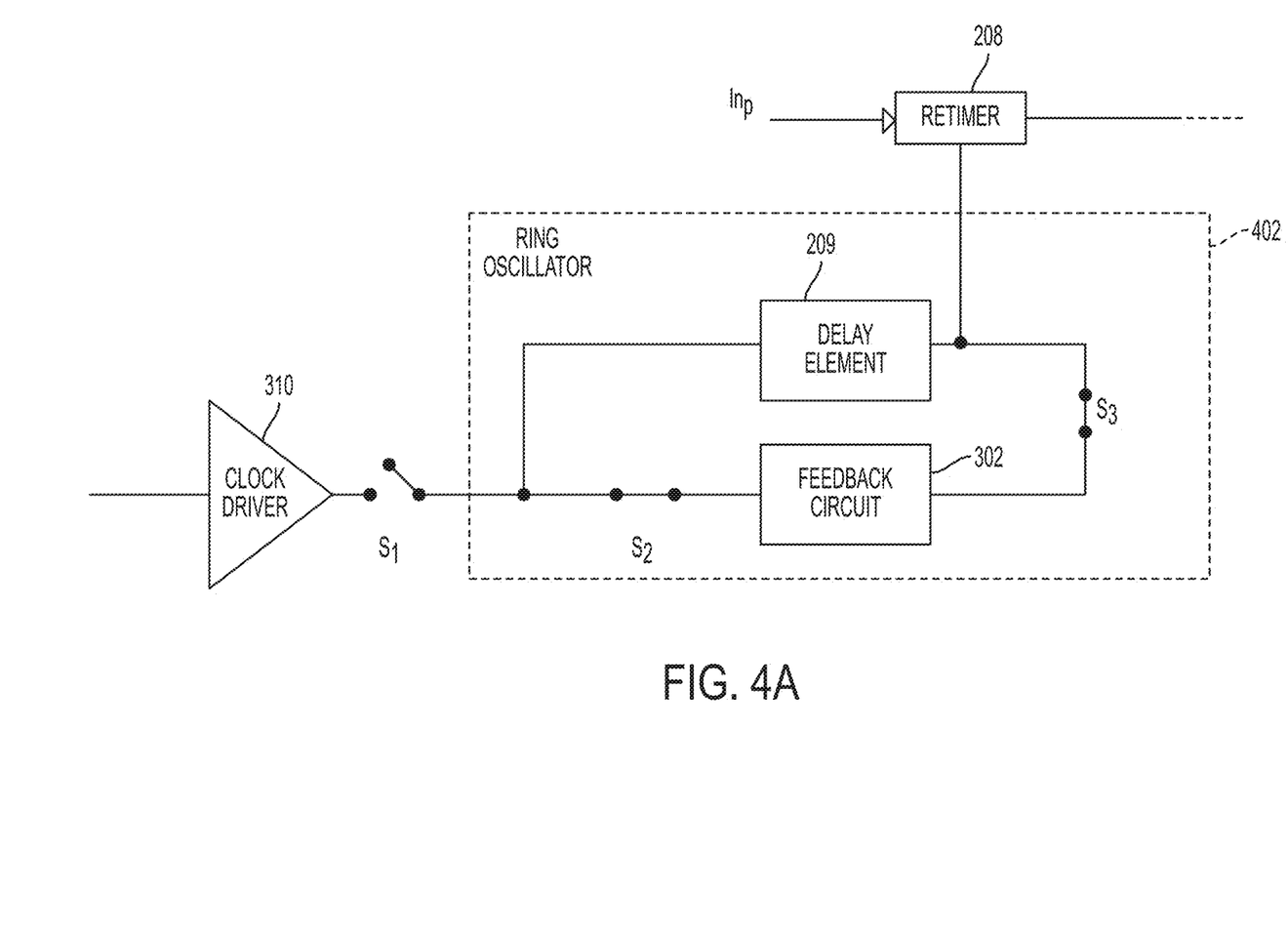
FIG. 4A is a block diagram illustrating the circuit of FIG. 3 operating in a first mode, according to some non-limiting embodiments.

FIG. 4A illustrates circuit 300 while operating according to the phase indicated by block $232_A$, in which a first ring oscillator is formed. In this phase, switches S2 and S3 may be in an on-state, while switches S1 and S4 may be in an off-state. In this phase, delay element 209 and feedback circuit 302 may be connected to form a ring oscillator 402, which may be configured to sustain oscillating signals. The signal oscillating in ring oscillator 402 may be, at least in some embodiments, arise spontaneously when the ring oscillator is formed. The rise of these oscillating signals may be achieved in any suitable way. For example, feedback circuit 302 may include an odd number of inverters (e.g., three inverters) between delay element 209 and feedback circuit 302. In this phase, the cadence (e.g., the period or the frequency) of the oscillating signal arising in ring oscillator 402 may be sensed. The cadence of the oscillating signal may be expressed in terms of the signal delay $T_1$ through delay element 209 and the signal delay $T_{FB}$ through feedback circuit 302. For example, the period may be equal to $2(T_1+T_{FB})$.

Figure 4B:
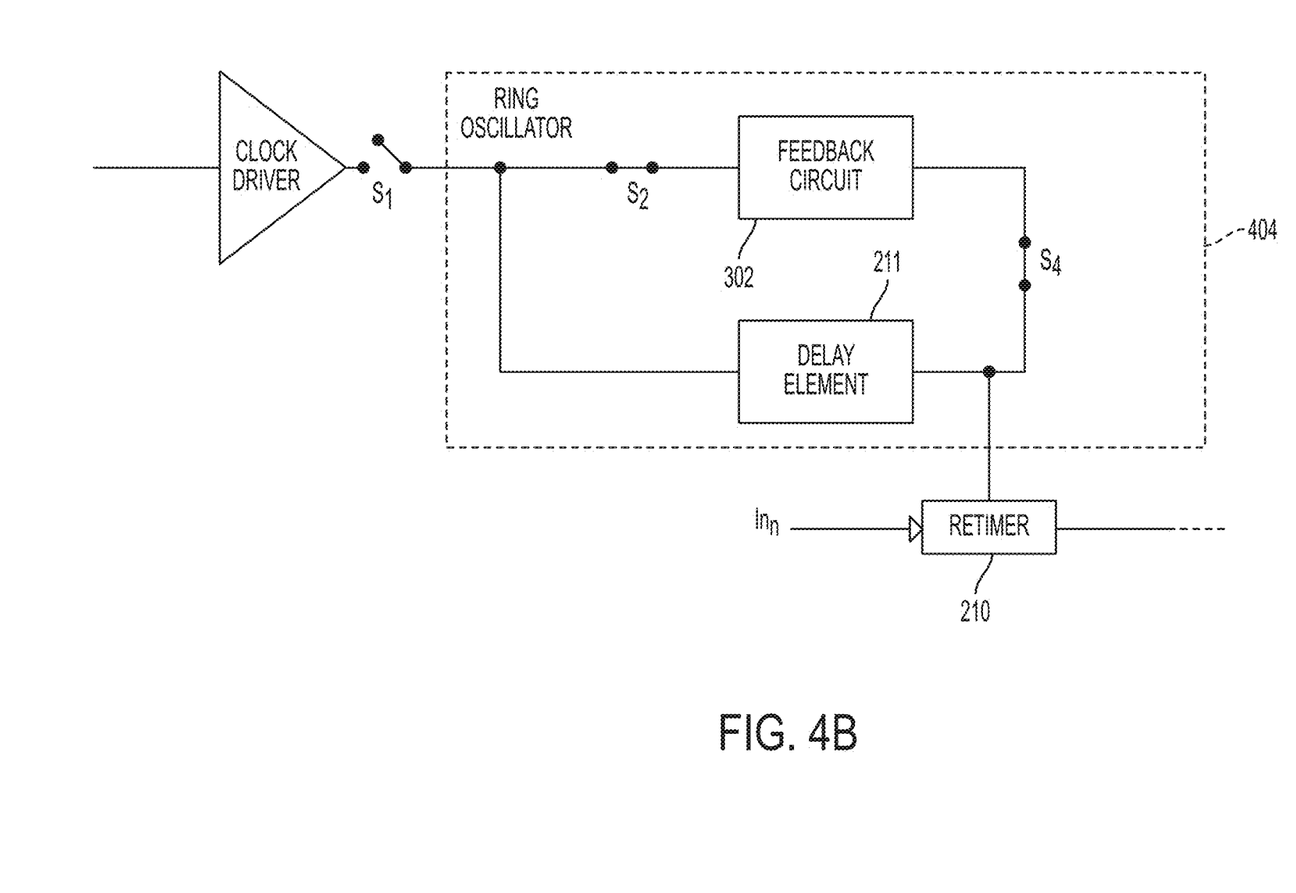
FIG. 4B is a block diagram illustrating the circuit of FIG. 3 operating in a second mode, according to some non-limiting embodiments.

FIG. 4B illustrates circuit 300 while operating according to the phase indicated by block $232_B$, in which a second ring oscillator is formed. In this phase, switches S2 and S4 may be in an on-state, while switches S1 and S3 may be in an off-state. In this phase, the cadence (e.g., the period or the frequency) of the oscillating signal arising (spontaneously arising, in some embodiments) in ring oscillator 404 may be sensed. The cadence of the oscillating signal may be expressed in terms of the signal delay $T_2$ through delay element 211 and the signal delay $T_{FB}$ through feedback circuit 302. For example, the period may be equal to $2(T_2+T_{FB})$.

In some embodiments, control-sense circuit 212 may sense the difference between the delay introduced by delay element 209 and the delay introduced by delay element 211 by computing the difference between the periods of ring oscillator 402 and ring oscillator 404. This difference, also referred to herein as "the skew", may be equal to $(2(T_1+T_{FB})-2(T_2+T_{FB}))/2=T_1-T_2$. Since the skew does not depend on the delay $T_{FB}$, large variations in $T_{FB}$ are tolerable. As a result, feedback circuit 302 may be designed with a small form factor, thus limiting real estate usage and power consumption.

In the compensation phase, delay $T_1$ and $T_2$ may be controlled such that $T_1-T_2$ substantially matches (e.g., with a disparity that is less than 1 ps, less than 10 ps, less than 100 ps, or less than 1 nm) the delay mismatch between connections 214 and 216.

Figure 4C:
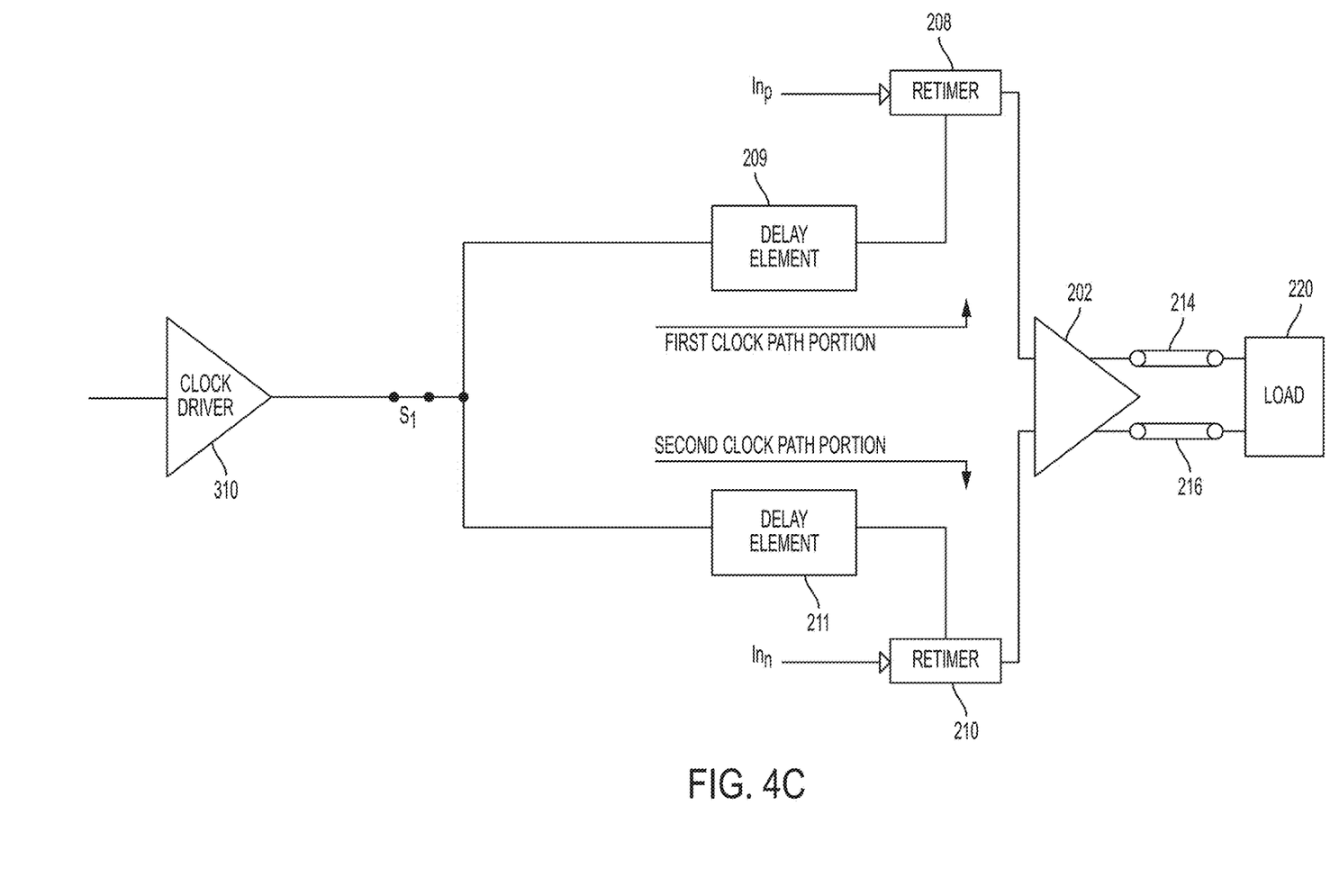
FIG. 4C is a block diagram illustrating the circuit of FIG. 3 operating in a third mode, according to some non-limiting embodiments.

FIG. 4C illustrates circuit 300 while operating according to the phase indicated by block 234, that is, the driving phase. In this phase, switch S1 may be in an on-state, while switches S2, S3 and S4 may be in an off-state. In this phase, delay elements 209 and 211 may provide paths for the clock signal clk to reach retimers 208 and 210, respectively. The retimers may delay the respective input signal based on the delay of the received clock. For example, in some embodiments, the clock signal received by a retimer may trigger the retimer (e.g., may dictate the time at which the respective input signal passes through the retimer). As a result, the delay introduced in the clock path can cause a delay in the data path. The phases illustrated in FIGS. 4A-4C may occur throughout non-overlapping time intervals.

Figure 4D:
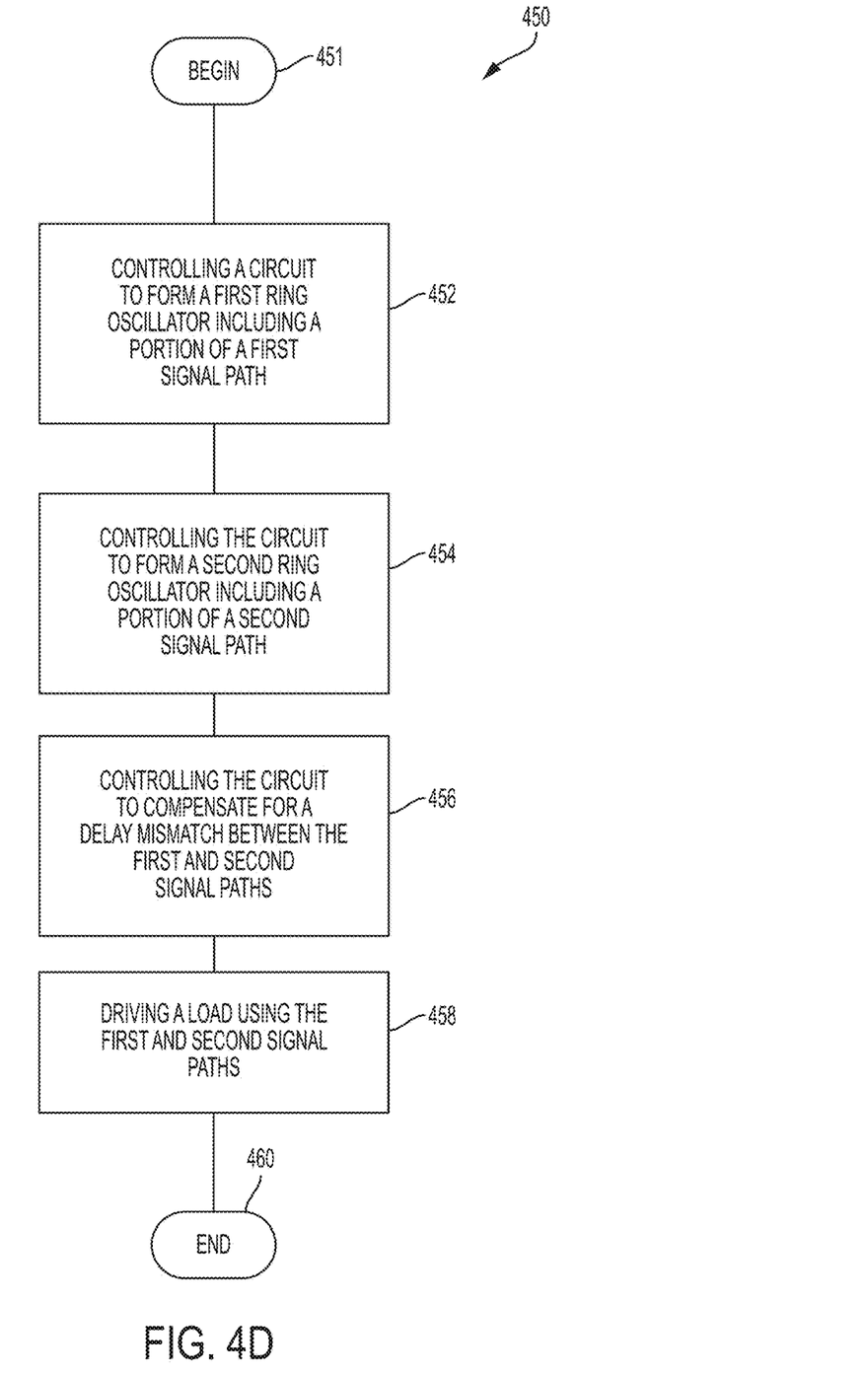
FIG. 4D is a flowchart illustrating a method for delay mismatch compensation, according to some non-limiting embodiments.

FIG. 4D illustrates a method for compensating a delay mismatch. Method 450 may begin at act 451. At act 452, a circuit (e.g., circuit 200) may be controlled to form a first ring oscillator during a first time period and sense a first cadence (e.g., a frequency or a period) of the first ring oscillator, the first ring oscillator being coupled to a portion of a first signal path for driving a load. At act 454, the circuit may be controlled to form a second ring oscillator during a second time period and sense a second cadence of the second ring oscillator, the second ring oscillator being coupled to a portion of a second signal path for driving the load.

At act 456, the circuit may be controlled to compensate for a delay mismatch between the first and second signal paths at least partially based on the first cadence and the second cadence. The first and second signals paths may include connections disposed outside the circuit. In some embodiments, it may be determined whether the compensation of the delay mismatch has been accomplished. For example, it may be determined whether $T_{D1}-T_{D2}=T_{D4}-T_{D3}$. If the compensation has been accomplished, method 450 may proceed to act 458. Otherwise, method 450 may iterate back to act 452, 454 or 456. For example, the delay introduced by delay elements 209 and/or 211 may be adjusted.

At act 458, the first signal path may be driven with a first signal and the second signal path may be driven with a second signal after the circuit is controlled to compensate for the delay mismatch. Method 450 may end at act 460.

Figure 5A:
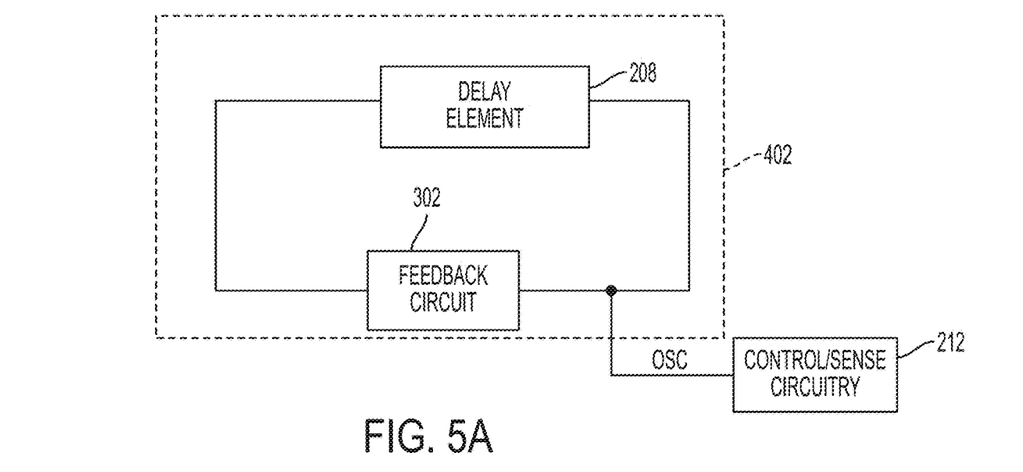
FIG. 5A is a block diagram illustrating a ring oscillator, according to some non-limiting embodiments.
Figure 5B:
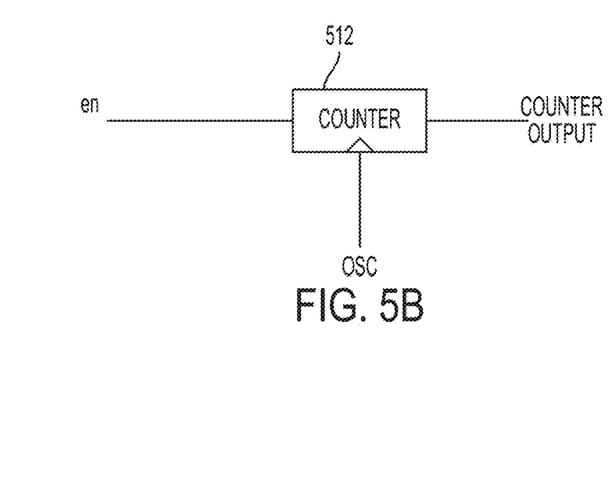
FIG. 5B is a block diagram illustrating a counter, according to some non-limiting embodiments.
Figure 5C:
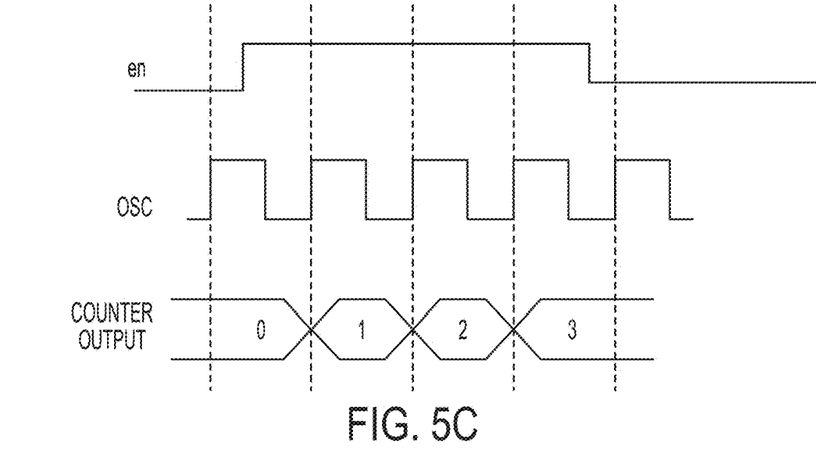
FIG. 5C is a plot illustrating the operations of the counter of FIG. 5B, according to some non-limiting embodiments.

While the examples described above are configured to compensate for delay mismatch by introducing a delay along the clock path, not all embodiments are limited in this respect. For example, some embodiments include delay elements that are part of the signal path between the input driver and the signal driver. In some such embodiments, the control circuitry may be configured to form a first ring oscillator during a first time period and sense a first cadence of the first ring oscillator, the first ring oscillator including the first signal path portion, form a second ring oscillator during a second time period and sense a second cadence of the second ring oscillator, the second ring oscillator including the second signal path portion, and compensate for a delay mismatch between the first and second signal paths at least partially based on the first cadence and the second cadence;

As described above, the delay difference between the delay elements in circuit 300 may be inferred by sensing the period of the ring oscillators. FIG. 5A illustrates schematically an arrangement in which control-sense circuitry 212 is configured to sense the period of ring oscillator 402. A similar arrangement may be used for ring oscillator 404. In some embodiments, as illustrated in FIGS. 5B-5C, the period of the oscillating signal may be sensed by counting its transitions (e.g., rising edges, falling edges or pulses) during a predefined time period. In some embodiments, control/sense circuitry 212 may include a counter 512. In response to receiving the oscillating signal "osc" and an enabling signal "en", counter 512 may output "counter output", a signal providing an indication of how may transitions have occurred during the enabling time. For example, as illustrated in FIG. 5C, counter 512 may count the number of rising edges throughout the period in which is enabled. The period of oscillating signal "osc", and hence the delay of the delay element, may be inferred from "counter output". In the example illustrated, three transitions are counted.

Figure 6:
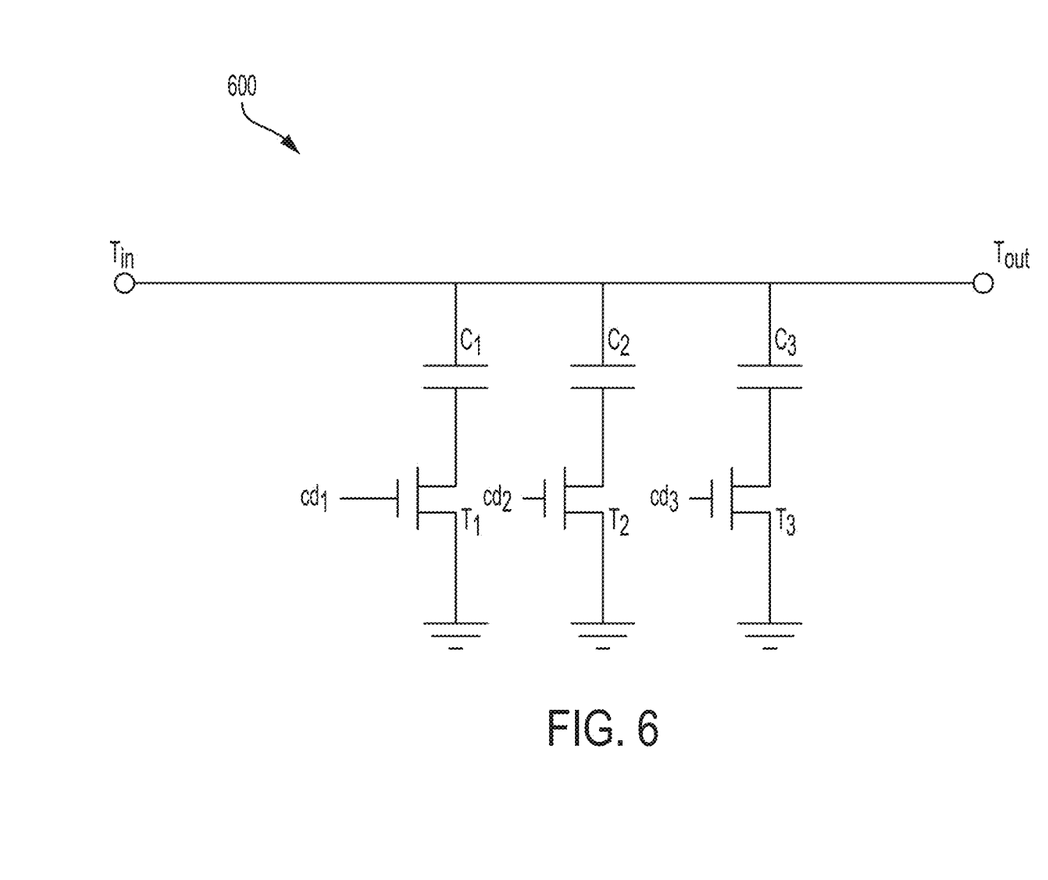
FIG. 6 is a circuit diagram illustrating an example of a delay element comprising a plurality of switched capacitors, according to some non-limiting embodiments.

Delay elements 208 and 210 may be implemented in any suitable way. In some embodiment, a delay element may be implemented using multiple switched capacitors, as illustrated in FIG. 6. Delay element 600 includes input and output terminals $T_{in}$ and $T_{out}$, capacitors C1, C2, and C3, and transistors T1, T2, and T3. Signals $Cd_1$, $Cd_2$, and $Cd_3$ may be used to enable transistors T1, T2, and T3, respectively. When a transistor is disabled, the corresponding capacitor may be floating. When a transistor is enabled, the corresponding capacitor may be active. By adjusting the number of active capacitors, the capacitance, and hence the delay, between $T_{in}$ and $T_{out}$ may be adjusted. The capacitances of capacitors C1, C2 and C3 may be equal or different from one another.

Circuits of the type described herein are not limited to use in connection with differential signals, but can be used in any circumstance in which it is desirable to compensate for delay mismatch between two or more signals. For example, in some circumstances, it is desirable to synchronize multiple circuits of an electronic circuit to one another. This is typically performed using clock signals. However, due to differences in the signal paths, which can be caused by fabrication tolerances or design choices, synchronization can be challenging. In some embodiments, circuits and methods of the type described herein may be used to compensate for delay mismatches between clock signals in an electronic system.

Figure 7A:
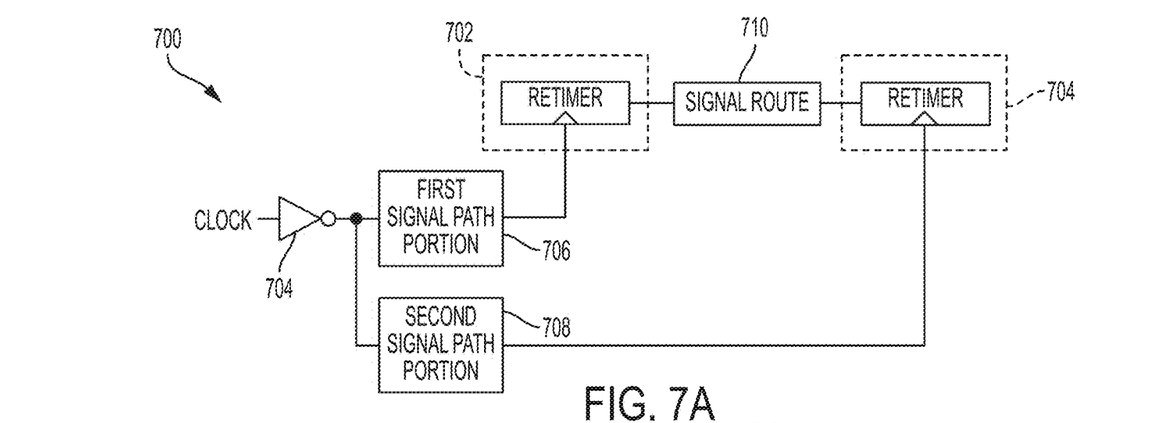
FIG. 7A is a block diagram illustrating a system having a plurality of circuits.
Figure 7B:
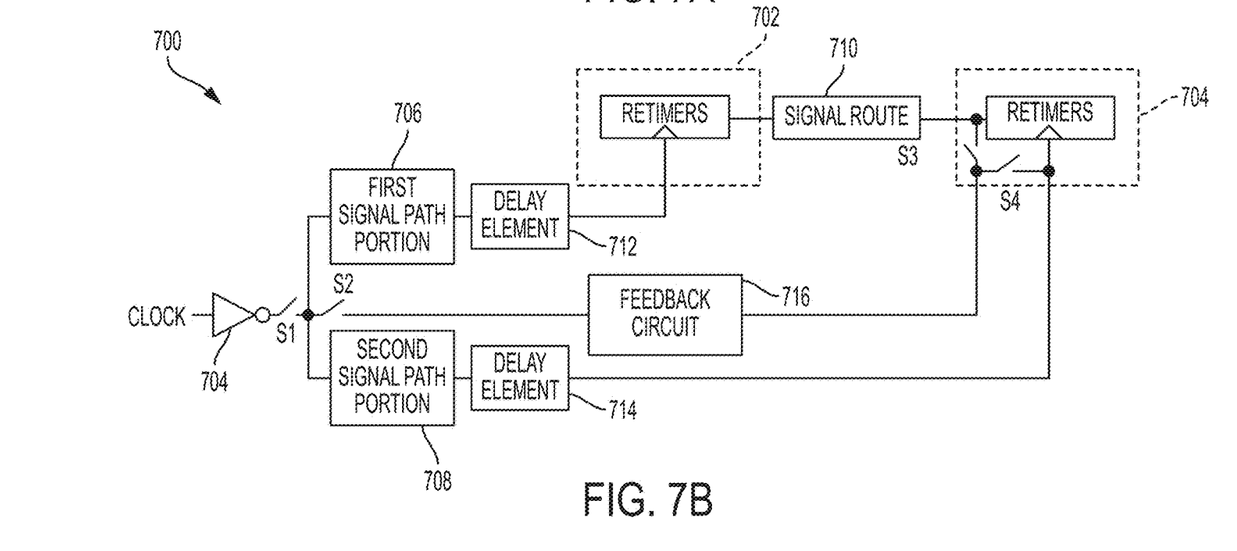
FIG. 7B is a block diagram of the circuit of FIG. 7A including a plurality of ring oscillators, according to some non-limiting embodiments.

FIG. 7A illustrates a system 700 including circuits 702 and 704. Circuits 702 may include any suitable type of analog and/or digital component, and may perform any suitable function. Circuits 702 and 704 may receive a clock signal via buffer 704, and first signal path portion 706 and second signal path portion 708, respectively. First and second signal path portions 706 and 708 may have different lengths in some embodiments. In some embodiments, circuits 702 and 704 are connected to each other via a signal route 710, which may include any suitable type of electronic device, and/or conductive connections. In some embodiments, circuits 702 and 704 may include retimers, which may be configured to receive the clock signal, and retime it a desired time base. In some circumstances, it is desirable that circuits 702 and 704 operate synchronously. One way to ensure synchronous operations is to cancel, or at least limit, delay mismatches encountered by the clock signal as it travels along first and the second path portions 706 and 708, and signal route 710.

In some embodiments, delay mismatch may be compensated by using the techniques described in connection with FIGS. 4A-4B. Accordingly, delay elements 712 and 714 may be introduced as a part of, or in series to, first signal path portions 706 and 708, respectively. In addition, feedback circuit 716 may be included such that, during a first phase, a first ring oscillator comprising first signal path portion 706, delay element 712, at least a portion of circuit 702, signal route 710 and feedback circuit 716 is formed, and during a second phase, a second ring oscillator comprising second signal path portion 708, delay element 714, at least a portion of circuit 704, and feedback circuit 716 is formed. Switching between the driving phase and the compensation phases may be accomplished using switches S1, S2, S3, and S4 as described in FIGS. 4A-4C.

It should be appreciated that delay elements and feedback circuit(s) as described in connection with FIGS. 4A-4C may be included in any suitable system suffering from signal delay mismatch.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

What is claimed is:

1. A circuit for driving a load, the circuit comprising:
an integrated circuit comprising:
a first contact coupled to a first connection disposed outside the integrated circuit and a second contact coupled to a second connection disposed outside the integrated circuit;
an input driver;
a first signal path portion that is a portion of a first signal path from the input driver to the load, the first signal path portion including the first contact of the integrated circuit;
a second signal path portion that is a portion of a second signal path from the input driver to the load, the second signal path portion including the second contact of the integrated circuit;
a first clock path portion configured to provide a first clock signal to control a timing of the first signal path portion;
a second clock path portion configured to provide a second clock signal to control a timing of the second signal path portion; and
control circuitry configured to:
control the first clock path portion to form a first ring oscillator with a delay element during a first time period and sense a first cadence of the first ring oscillator;
control the second clock path portion to form a second ring oscillator with the delay element during a second time period and sense a second cadence of the second ring oscillator;
control the circuit to introduce a delay mismatch between the first clock signal as received at the first signal path portion and the second clock signal as received at the second signal path portion at least partially based on the first cadence and the second cadence, thereby causing a first output signal at the first contact of the integrated circuit to be delayed relative to a second output signal at the second contact of the integrated circuit.

2. The circuit of claim 1, wherein the first signal path portion comprises a first retimer.

3. The circuit of claim 2, wherein the first clock path portion comprises a delay element.

4. The circuit of claim 2, wherein the second signal path portion comprises a second retimer.

5. The circuit of claim 1, wherein the control circuitry is further configured to sense a first delay introduced by a first controllable delay element that is part of the first clock path portion, sense a second delay introduced by a second delay element part of the second clock path portion, and compute a difference between the first and second delay.

6. The circuit of claim 1, wherein the first and second ring oscillators share a common feedback circuit.

7. The circuit of claim 1, wherein the first cadence comprises a first oscillation period and the second cadence comprises a second oscillation period.

8. The circuit of claim 1, wherein the first and second time periods do not overlap.

9. The circuit of claim 1, wherein the control circuitry is configured to control the integrated circuit to introduce the delay mismatch based on a delay mismatch existing between the first and second connections disposed outside the integrated circuit.

10. The circuit of claim 9, further comprising a memory configured to store information indicative of the delay mismatch existing between the first and second connections.

11. The circuit of claim 1, wherein the integrated circuit is disposed on a PCB, and wherein the first and second connections connect the first and second contacts, respectively, to the load.

12. A circuit for driving a load, the circuit comprising:
an integrated circuit comprising:
    a first contact coupled to a first connection disposed outside the integrated circuit and a second contact coupled to a second connection disposed outside the integrated circuit;
    a clock driver;
    a feedback circuit;
    a first signal path portion comprising the first contact of the integrated circuit and a first retimer;
    a first delay element coupled between the first retimer and the clock driver;
    a second signal path portion comprising the second contact of the integrated circuit and a second retimer;
    a second delay element coupled between the second retimer and the clock driver; and
    control circuitry configured to delay a first output signal at the first contact of the integrated circuit relative to a second output signal at the second contact of the integrated circuit by controlling the first and second delay elements;
    wherein the feedback circuit and the first delay element form a first ring oscillator and the feedback circuit and the second delay element form a second ring oscillator.

13. The circuit of claim 12, wherein the first ring oscillator is configured to provide a first resonating signal and the second ring oscillator is configured to provide a second resonating signal.

14. The circuit of claim 12, wherein the first delay element is configured to trigger the first retimer and the second delay element is configured to trigger the second retimer.

15. The circuit of claim 12, wherein each of the first and second delay element comprises a plurality of switched capacitors.

16. A method for driving a load disposed outside an integrated circuit, the method comprising:
    controlling a circuit to form a first ring oscillator during a first time period and sensing a first cadence of the first ring oscillator, the first ring oscillator including a portion of a first clock path, wherein the circuit is disposed on the integrated circuit and the integrated circuit comprises a first contact coupled to a first connection disposed outside the integrated circuit and a second contact coupled to a second connection disposed outside the integrated circuit;
    controlling the circuit to form a second ring oscillator during a second time period and sensing a second cadence of the second ring oscillator, the second ring oscillator including a portion of a second clock path;
    controlling the portion of the first clock path to command a timing of a portion of a first signal path and controlling the portion of the second clock path to command a timing of a portion of a second signal path to introduce a delay mismatch between a first output signal at the first contact of the integrated circuit and a second output signal at the second contact of the integrated circuit at least partially based on the first cadence and the second cadence; and
    driving the first signal path with the first output signal and driving the second signal path with the second output signal after the circuit is controlled to introduce the delay mismatch.

17. The method of claim 16, wherein controlling the portion of the first clock path to command the timing of the portion of the first signal path comprises adjusting a delay in the portion of the first clock path.

18. The method of claim 16, wherein sensing the first cadence of the first ring oscillator comprises counting how many transitions occur throughout a sensing time interval.

19. The method of claim 16, wherein controlling the portion of the first clock path to command a timing of a portion of a first signal path and controlling the portion of the second clock path to command a timing of a portion of a second signal path to introduce a delay mismatch comprises:
    introducing the delay mismatch to counteract a delay mismatch existing between the first and second connections disposed outside the integrated circuit.

20. The method of claim 19, further comprising retrieving information indicative of the delay mismatch existing between the first and second connections from a memory of the circuit.

* * * * *